(12) United States Patent
Tam et al.

(10) Patent No.: US 6,270,621 B1
(45) Date of Patent: Aug. 7, 2001

(54) ETCH CHAMBER

(75) Inventors: Simon W. Tam, San Jose; Semyon Sherstinsky, San Francisco; Mei Chang, Cupertino; Alan Morrison, San Jose; Ashok Sinha, Palo Alto, all of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/593,018

(22) Filed: Jun. 13, 2000

Related U.S. Application Data

(62) Division of application No. 08/327,126, filed on Oct. 21, 1994, now Pat. No. 6,123,864, which is a continuation of application No. 08/071,462, filed on Jun. 2, 1993, now abandoned.

(51) Int. Cl.[7] .............................. H01L 21/00; H05H 1/00
(52) U.S. Cl. ............................................................ 156/345
(58) Field of Search ............................ 156/345; 118/728, 118/723 R, 723 E

(56) References Cited

U.S. PATENT DOCUMENTS

| | | | |
|---|---|---|---|
| 3,901,499 | 8/1975 | Sporrer | 269/156 |
| 4,842,683 | 6/1989 | Cheng et al. | 156/345 |
| 4,869,801 | 9/1989 | Helms et al. | 204/298 |
| 4,944,860 | 7/1990 | Bramhall, Jr. et al. | 204/298.23 |
| 4,956,043 | 9/1990 | Kanetomo et al. | 156/345 |
| 4,978,412 | 12/1990 | Aoki et al. | 156/345 |
| 5,009,738 | 4/1991 | Gruenwald et al. | 156/345 |
| 5,078,851 | 1/1992 | Nishihata et al. | 204/298.34 |
| 5,094,885 | 3/1992 | Selbrede | 427/248.1 |
| 5,292,399 | 3/1994 | Lee et al. | 156/643 |
| 5,298,720 | 3/1994 | Cuomo et al. | 219/121.43 |
| 5,304,248 | 4/1994 | Cheng et al. | 118/728 |
| 5,316,278 | 5/1994 | Sherstinsky et al. | 269/298.15 |
| 5,343,938 | 9/1994 | Schmidt | 165/80.2 |

*Primary Examiner*—Thi Dang
(74) *Attorney, Agent, or Firm*—Birgit E. Morris

(57) ABSTRACT

A conventional plasma etch chamber is modified to reduce particulate generation in the chamber that contaminates the chamber and substrates mounted on a pedestal support being processed therein. A clamping ring cover in the chamber is made of ceramic. Grooves are machined into the cover and metal antennas can be mounted in the grooves to act as a getter for particles and pre-particle, non-volatile contaminants in the chamber. The clamping ring for the substrate being processed is also made of ceramic. Fewer particles are generated by ion bombardment using ceramic versus prior art clamping rings made of aluminum. Further, the cylinder clamping ring support which surrounds the pedestal support is fitted with a plurality of openings or windows to allow escape of purge gases that carry particles through the windows and into the adjoining exhaust system of the chamber and thus also away from the substrate being processed. Markedly fewer particles are deposited onto substrates using the modified plasma etch chamber of the invention than was found for unmodified chambers.

3 Claims, 4 Drawing Sheets

ETCH CHAMBER

This application is a division of Ser. No. 08/327,126 filed Oct. 21, 1994, now U.S. Pat. No 6,123,864 which is a continuation of Ser. No. 08/071,462 filed Jun. 2, 1993 now abandoned.

This invention relates to an apparatus for processing semiconductor substrates. More particularly, this invention relates to an improved etch chamber for processing semiconductor substrates.

BACKGROUND OF THE INVENTION

Plasma etch chambers for processing semiconductor substrates are well known and can be exemplified by reference to the prior art chamber of FIG. 1.

Referring to FIG. 1, a semiconductor substrate to be etched 20 is mounted on an RF powered cathode support pedestal 22 which is mounted in a vacuum chamber 10. A showerhead gas distribution plate 26 allows etchant plasma precursor gas to enter the vacuum chamber from an external source 28. The gas distribution plate 26 can also act as the anode which is electrically grounded. A source of coolant gas can also be supplied to the chamber through a passage 32 in the pedestal 22. The coolant gas enters the space between the backside of the substrate 20 and the top of the support pedestal 34 and serves to couple the temperature regulated support pedestal 22 and the substrate 20 to ensure temperature regulation of the substrate 20 during processing. The support pedestal 22 can be heated or cooled during processing; however, generally the large thermal mass of the support pedestal 22 relative to the mass of the substrate 20 serves to dissipate heat generated in the substrate 20 during the plasma etching process, thereby controlling the substrate temperature during processing.

Surrounding the pedestal support 22 is a cylindrical support 36 which is larger in diameter than the pedestal support 22, to allow independent vertical movement of the cylindrical support 36.

In addition, a metal clamping ring 38 overlies the substrate 20 during processing. The clamping ring is supported on the cylindrical support 36 at all times. During processing, the cylindrical support 36 is lowered so that the clamping ring 38 contacts the substrate 20.

Since the prior art etch chamber of FIG. 1 is meant for continuous operation, particulates can build up in the chamber from various plasma and etch species. Since if these particulates deposit onto the surface of the substrate 20 they will reduce the yield of good devices from the substrate 20, reduction of particles generated in the etch chamber and prompt removal of any particulates that do form during processing is mandatory.

Thus a continuous load lock purge has been used to maintain a positive pressure between an adjacent load lock chamber and the processing etch chamber, and to prevent particulates from contact with the substrate. This continuous load lock purge has been moderately successful in reducing the formation of particles and in the prompt removal of any particles that do form in the chamber.

The chamber 10 is designed for continuous usage and many hundreds of substrates are desirably processed consecutively before taking the chamber 10 apart for cleaning. Thus the chamber 10 becomes more contaminated and the number of particles therein increases over time. Since cleaning the chamber 10 is expensive, we sought to determine the causes of particle generation in the above chamber and to find ways of reducing the number of particles generated and collected in the chamber, both to reduce contamination of the substrates and to increase the time or number of processing cycles between cleanings.

SUMMARY OF THE INVENTION

The present invention provides several improvements to an etch chamber that reduces particle formation.

A cover for the clamping ring is made of an inert, rigid, ceramic material having grooves in its upper surface. The grooves in the clamping ring cover allow the collected or gettered particles to be removed from the etch chamber by the gas stream exiting the chamber into the chamber exhaust system.

Metal antennas can be inserted into openings in the ceramic cover. The metal antennas act as getters for particles in an area away from the substrate being processed.

The clamping ring of the invention is made from ceramic instead of metal, and, because ceramics are electrically neutral, ion bombardment of the clamping ring is avoided or reduced, which bombardment also produces particles in the chamber.

The clamping ring support cylinder on which the clamping ring is supported in the chamber, is provided with a plurality of openings or windows to allow particles generated during processing to be carried away from the substrate with a continuous load lock purge gas stream which exits the chamber through its exhaust system.

The resultant modified etch chamber of the invention contains fewer particles, even after many hundreds of substrates have been processed in the chamber.

DETAILED DESCRIPTION OF THE INVENTION

The clamping ring cover of the modified chamber of the invention is made of ceramic instead of a plastic such as Lexan™ polycarbonate. We have found that plastic clamping ring cover materials, which have a different coefficient of expansion than other components of the chamber that it contacts, which are usually made of aluminum or stainless steel, can flex during heating and cooling of the chamber between processing cycles. Metal deposits, as well as deposits from less volatile by-product gases and other particles, deposit on the cover and flake off when the cover flexes. We have found that this is a major source of particles in the chamber.

Figure 2:
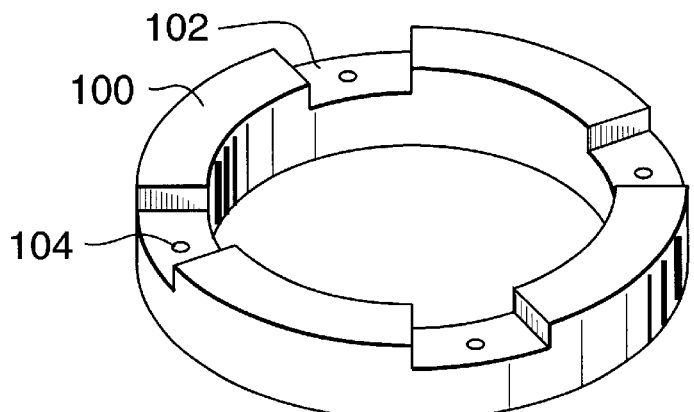
FIG. 2 is a perspective view of a clamping ring cover of the invention.

In accordance with the present invention, the modified clamping ring cover is made from an inert, rigid ceramic material that does not flex during heating and cooling cycles. The modified clamping ring cover is shown in FIG. 2. FIG. 2 illustrates a grooved clamping ring cover 100 having one or more grooves 102 machined therein. These grooves 102 aid in removal of various by-product materials through the chamber exhaust system which, if trapped, may become particles. Into these grooves a plurality of metal "antennas", or bolts 104 are inserted into openings in the grooves 102. These antennas or bolts 104 are electrically connected to the support pedestal, upon which the substrate to be processed is mounted, thereby acquiring a charge. The antennas 104 attract non-volatile, oppositely charged fragments of by-product gases which otherwise can produce particles. Such particles and particulate-forming species collect on the antennas 104, rather than on the substrate being processed. Since the antennas 104 are placed in the clamping ring cover, which is far removed from the substrate, the attraction of charged species and particles to the antennas 104 reduces the number of particles that collect on the surface of the substrates during processing, and the grooves 102 allow these particle-forming species to be carried away from the substrate to the exhaust system of the chamber.

Figure 1:
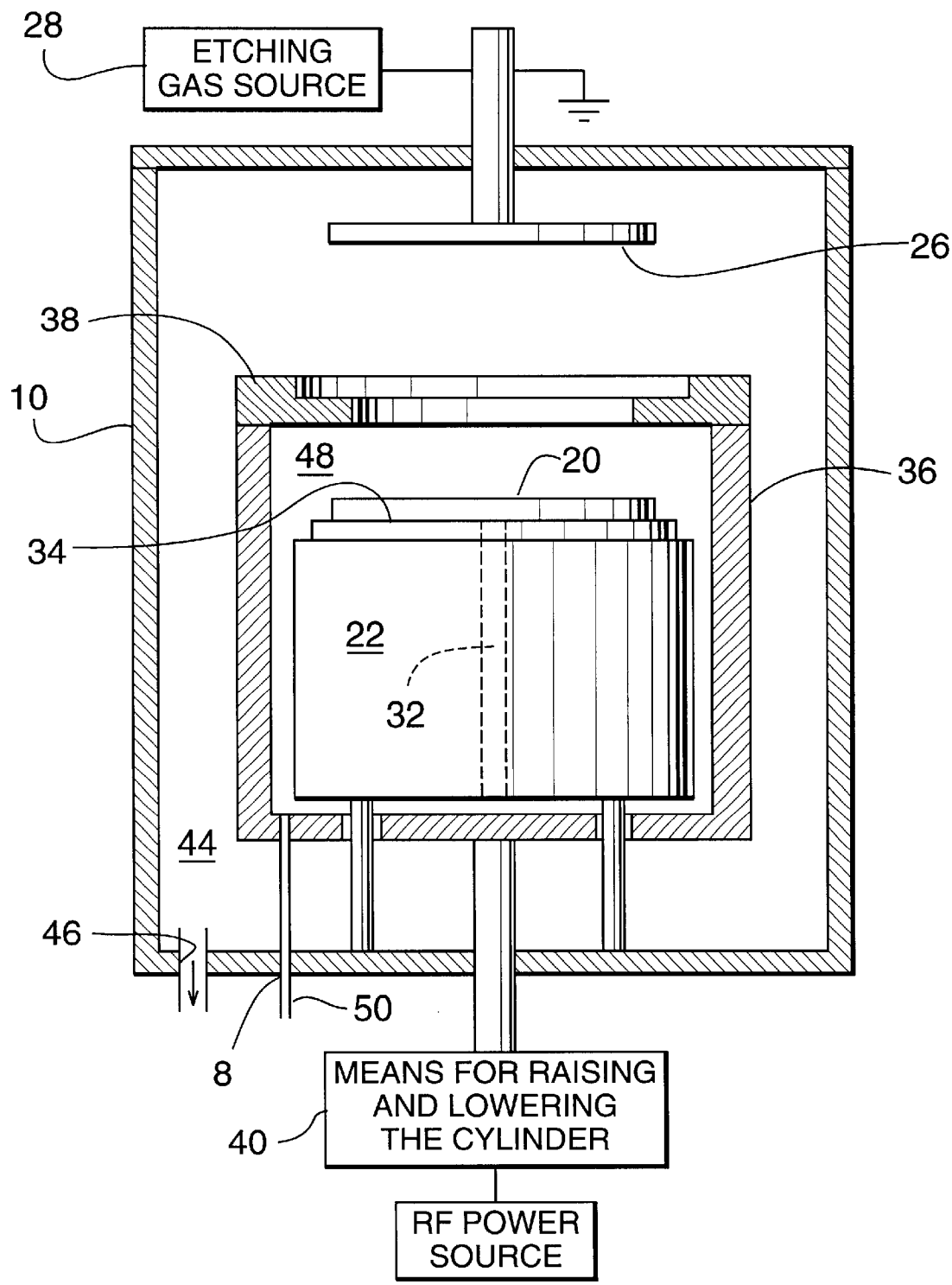
FIG. 1 is a cross sectional, partially schematic view of an etch chamber of the prior art.
Figure 3:
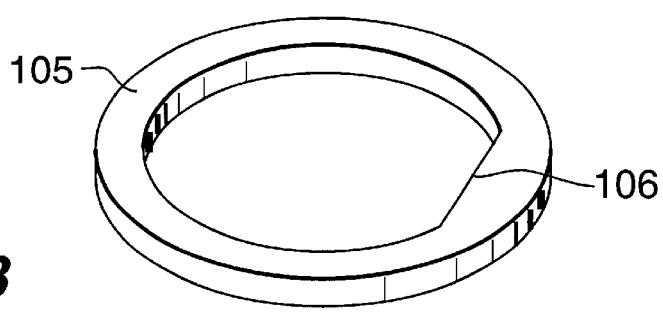
FIG. 3 is a perspective view of a clamping ring of the invention.

In an additional modification of etch chambers in accordance with the present invention, the clamping ring, formerly made of aluminum, is made of a ceramic material such as alumina. FIG. 3 is a top view of a clamping ring of the invention. Aluminum clamping rings attract particles generated in the chamber. Further, when the clamping ring is moved up and down between processing cycles, these particles can flake off, causing the particles to drift into the area of the substrate. In the prior art chamber such as shown in FIG. 1 discussed hereinabove, the aluminum clamping ring becomes charged during processing, since during processing the substrate is mounted on the pedestal, and the clamping ring is in contact with the substrate. This charge attracts oppositely charged and neutral ions.

In addition, aluminum is subject to ion bombardment during processing. This bombardment provides another source of aluminum particles, which deposit onto the substrate surface as well as onto the aluminum clamping ring. During vertical movement of the clamping ring between cycles, these particles also flake off to further contaminate the chamber.

Another advantage of the ceramic clamping rings of the invention is that, because ceramic is a dielectric material, its temperature rises during processing. The elevated temperature also inhibits or prevents deposition of volatile particles or ions from depositing onto the clamping ring.

A ceramic clamping ring 105 of the invention, as shown in FIG. 3, can be machined readily so that there is a minimum overlay of the clamping ring and the substrate during processing. This is advantageous for several reasons; it increases the surface area of the substrate which can be processed; and the clamping ring can be shaped readily, as by machining, so as to accommodate variously sized semiconductor wafer flats 106, widely used for orientation purposes.

Another modification that has been found to reduce the number of particles in the vicinity of the substrates being processed is made to the cylindrical support for the clamping ring mount.

Figure 4:
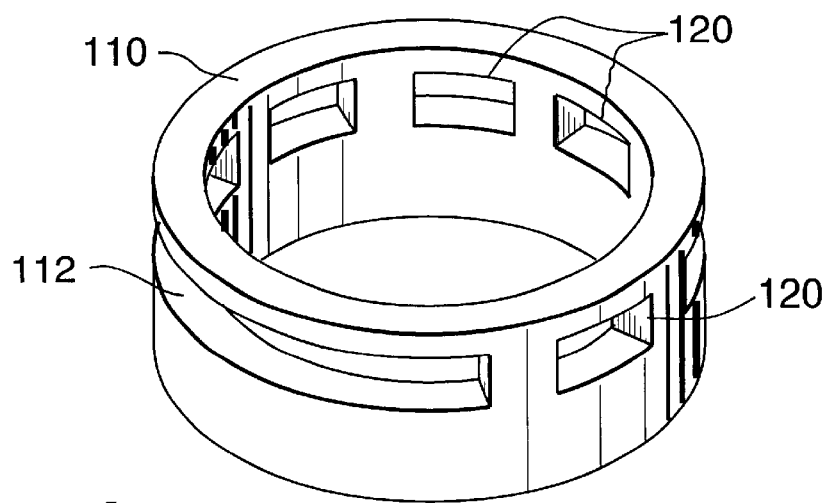
FIG. 4 is a perspective view of a cylindrical support for the clamping ring of the invention.

A cylindrical support of the invention is shown in FIG. 4.

We have modified the cylindrical support 110 for the clamping ring to provide a plurality of openings or windows 120 therein which permit the continuous load lock gas to exit from the interior of the cylinder 110 from a plurality of these openings 120 throughout the lower portion of the chamber, rather than from a single opening opposite the slit valve used to transfer the substrate into and out of the present chamber. The load lock purge gas thus carries most of the particles trapped or generated inside the cylinder 110 through these windows 120 to the chamber exhaust system, whence they are removed.

Thus in accordance with the modifications described above, a low particulate environment is maintained in the chamber, particularly in the area of the substrate being processed.

Figure 5:
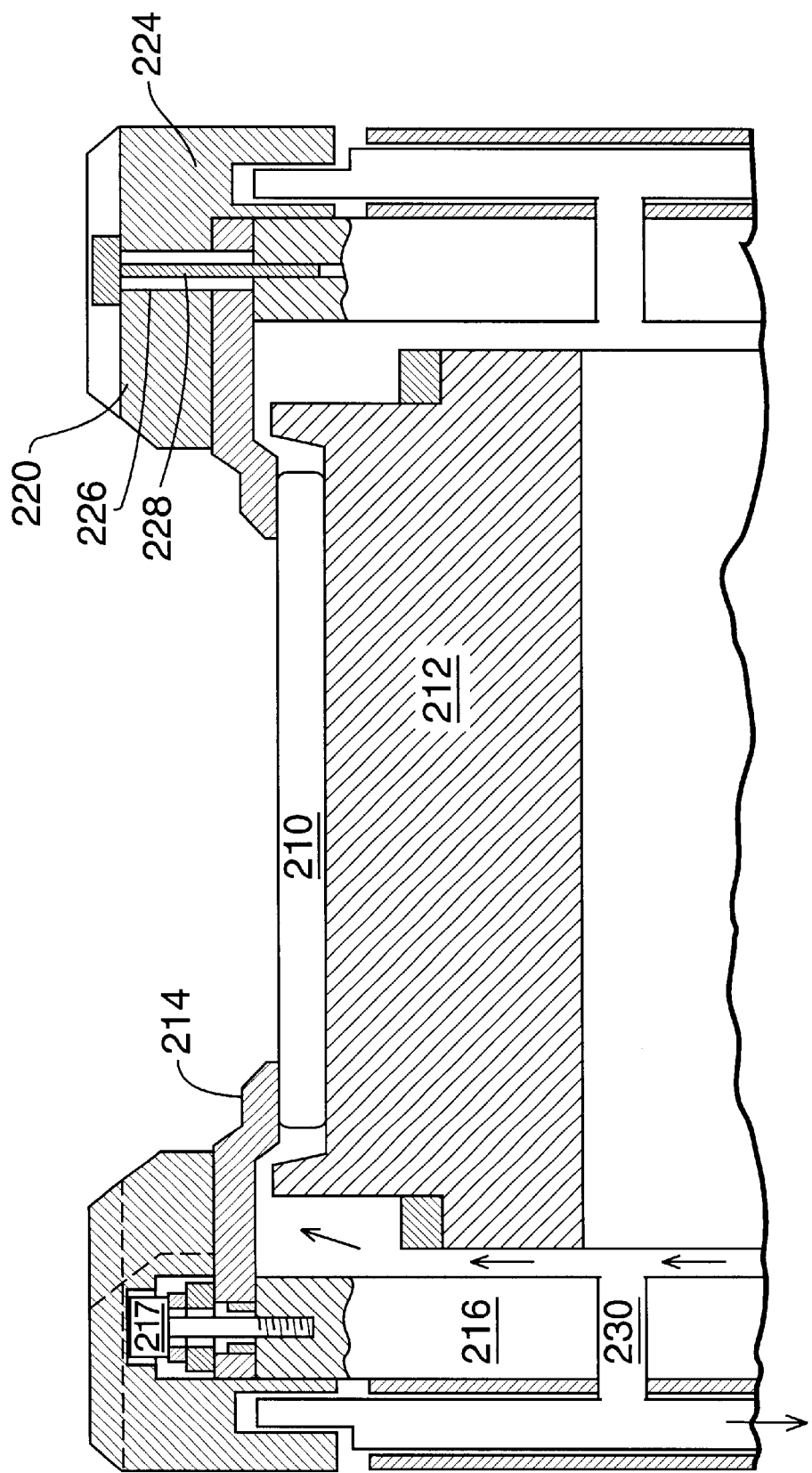
FIG. 5 is a partial cross sectional view of an etch chamber modified so as to use the features of the present invention.

FIG. 5 is a partial, expanded view of an etch chamber including the various features of the invention. A wafer 210 is mounted on a pedestal 212. A ceramic clamping 214 overlies the edge of the wafer 210 and in turn it is supported on a cylindrical support 216 fastened by several bolts 217.

The ceramic cover 224, shown only partially, has a groove 226 cut therein into which is mounted a metal antenna 228. Windows 230 in the walls of the cylindrical support 216 provide a passage for purge gas to pass through the cylinder 216 and out to the exhaust system of the chamber.

The above modifications and improvements to an etch chamber result in a marked reduction in the number of particles that deposit onto a substrate in the chamber. This of course increases the yield of good devices obtainable from the substrate, and also increases the time between periodic cleanings of the chamber, thereby reducing down time and further contributing to the economies of the present chamber.

Figure 6:
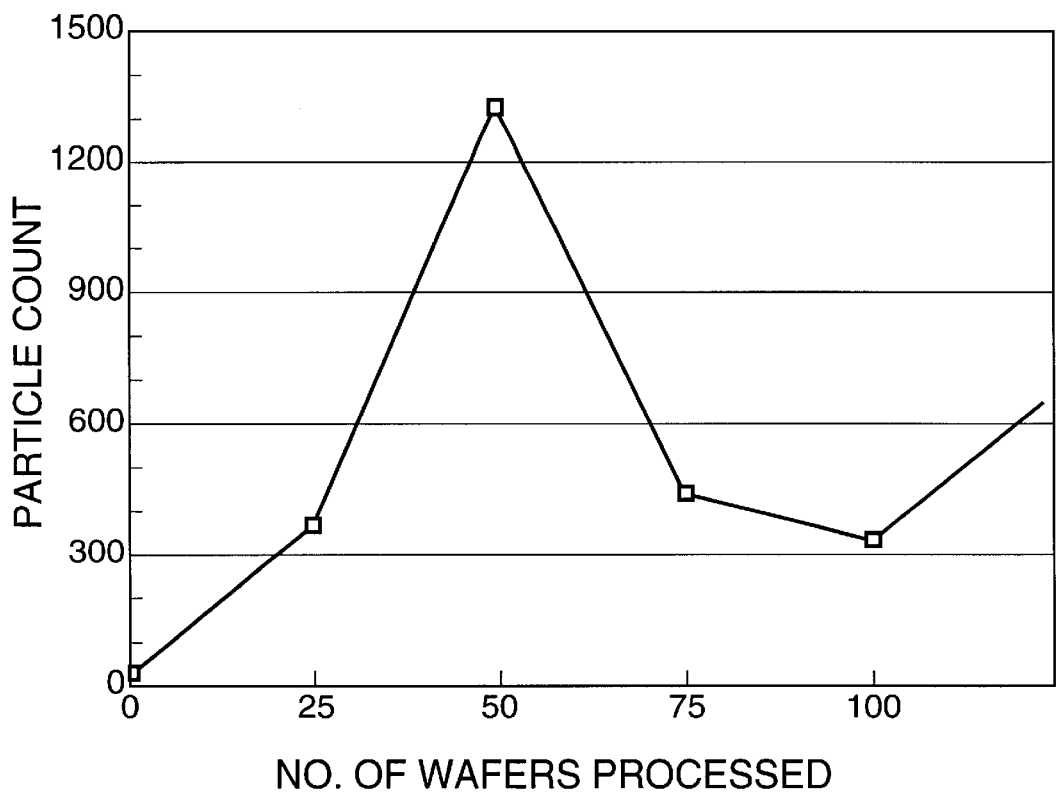
FIG. 6 is a graph of the number of particles on a silicon wafer versus the number of silicon wafers processed using a prior art chamber of FIG. 1.
Figure 7:
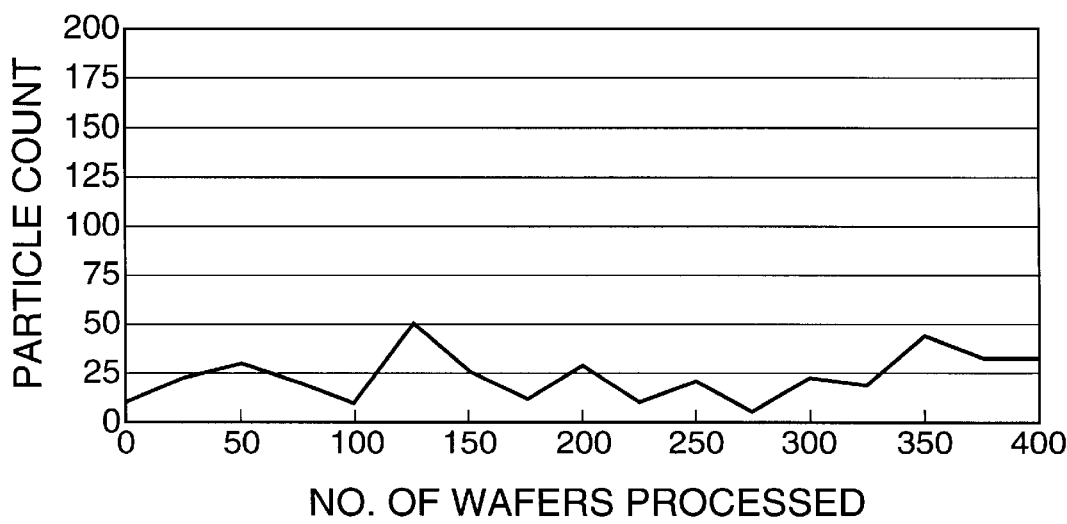
FIG. 7 is a graph of the number of particles on a silicon wafer versus the number of silicon wafers processed using a chamber modified in accordance with the invention.

The improvement in particle deposition can be readily seen by referring to FIGS. 6 and 7.

FIG. 6 is a graph of the number of particles counted on sequentially processed silicon wafers versus the number of silicon wafers processed in an etch chamber of the prior art. Particles having a particle size of 0.3 micron or higher were counted. The graph of FIG. 6 was obtained from a prior art chamber having a Lexan™ clamping ring cover, an aluminum clamping ring and a clamping ring support cylinder having a single opening opposite a slit valve for loading and unloading substrates onto the support pedestal.

It can be seen that over 300 particles were found after only 25 silicon wafers were processed in the chamber, and the number of particles rose as high as 1300 or more after 50 silicon wafers had been processed in the chamber. The particle count was never less than 300. This number of particles is unacceptable for present-day silicon wafer processing.

FIG. 7 is a graph of particle count versus number of silicon wafers processed in a chamber modified in accordance with the present invention. This chamber had a grooved ceramic cover with metal antennas bolted therein; a ceramic clamping ring; and a clamping ring support cylinder having a plurality of windows therein.

It is apparent that, in contrast to the prior art chamber, a maximum of 50 particles were ever deposited onto the processed silicon wafers, even after processing up to 400 silicon wafers in the chamber.

Thus the reduction in the number of particles deposited onto semiconductor substrates was from 6 fold to 52 fold in the modified chamber of the invention.

Although the modified chambers of the invention have been described in terms of certain specific embodiments, various modifications can be made in terms of configuration and materials as will be apparent to one skilled in the art. The invention is meant only to be limited by the appended claims.

We claim:

1. A plasma etch chamber comprising a pedestal support for a substrate to be processed;

a gas distribution plate having openings therein for process gases above and opposed to said pedestal;

a vacuum exhaust system;

a clamping ring assembly mounted in said chamber so as to overlie a portion of said substrate during processing; and a mount for supporting said clamping ring extending from a bottom wall of said chamber and having a plurality of openings in a sidewall thereof.

2. An etch chamber according to claim 1 wherein one of said openings is opposite a slit valve used to transfer a substrate to be processed into and out of said chamber.

3. An etch chamber according to claim 1 wherein a coolant gas inlet is mounted in a bottom wall of said chamber within the clamping ring mount.

* * * * *